United States Patent
Kobayashi

(10) Patent No.: US 10,181,854 B1
(45) Date of Patent: Jan. 15, 2019

(54) LOW POWER INPUT BUFFER USING FLIPPED GATE MOS

(71) Applicant: Dialog Semiconductor (UK) Limited, London (GB)

(72) Inventor: Daisuke Kobayashi, Tokyo (JP)

(73) Assignee: Dialog Semiconductor (UK) Limited, London (GB)

( * ) Notice: Subject to any disclaimer, the term of this patent is extended or adjusted under 35 U.S.C. 154(b) by 0 days.

(21) Appl. No.: 16/009,478

(22) Filed: Jun. 15, 2018

(51) Int. Cl.
H03K 19/0185 (2006.01)
H03K 3/356 (2006.01)
H03K 5/24 (2006.01)

(52) U.S. Cl.
CPC . H03K 19/018521 (2013.01); H03K 3/35613 (2013.01); H03K 5/2481 (2013.01)

(58) Field of Classification Search
CPC ....... H03K 19/0175; H03K 19/017509; H03K 19/0185; H03K 19/018507; H03K 19/018521; H03K 19/018564; H03K 19/018571; H03K 5/22; H03K 5/24; H03K 5/2472; H03K 5/2481
See application file for complete search history.

(56) References Cited

U.S. PATENT DOCUMENTS

| 5,933,459 | A  | 8/1999 | Saunders et al. |
| 6,437,550 | B2 | 8/2002 | Andoh et al. |
| 7,727,833 | B2 | 6/2010 | Dix |
| 9,590,504 | B2 | 3/2017 | Al-Shyoukh et al. |
| 9,666,574 | B1* | 5/2017 | Lee ............... H01L 27/0883 |
| 2003/0197552 | A1 | 10/2003 | Watanabe |
| 2013/0195155 | A1 | 8/2013 | Pan et al. |
| 2015/0234412 | A1* | 8/2015 | Al-Shyoukh ........ G05F 3/20 323/313 |
| 2015/0234413 | A1* | 8/2015 | Al-Shyoukh ........ G05F 3/24 323/313 |
| 2016/0094124 | A1* | 3/2016 | Al-Shyoukh ........ G05F 3/242 323/271 |

OTHER PUBLICATIONS

"MOS Voltage Reference Based on Polysilicon Gate Work Function Difference," by Henri J. Oguey et al., IEEE Journal of Solid-State Circuits, vol. SC-15, No. 3, Jun. 1980, pp. 264-269.

(Continued)

Primary Examiner — Jason Crawford
(74) Attorney, Agent, or Firm — Saile Ackerman LLC; Stephen B. Ackerman; Billy Knowles

(57) ABSTRACT

An input buffer circuit providing an interface between integrated circuits having differing power supply voltage sources. A voltage reference generator that produces dual reference voltages employing a flipped gate anti-doped transistor. A receiver is connected to receive the first reference voltage and the second reference voltage and the input voltage signal from an integrated circuit operating with a low power supply and transmitting with the first voltage range. The receiver has a first comparator, a second comparator, and a latching circuit. The first comparator compares receive the input voltage and the first reference voltage and the second comparator compares the input voltage and the second reference voltage for determining the output state of the receiver. The output of the receiver provides the data output signal from the input buffer.

32 Claims, 9 Drawing Sheets

(56) References Cited

OTHER PUBLICATIONS

"A 500nA Quiescent Current, Trim-Free, ± 1.75% Absolute Accuracy, CMOS-Only Voltage Reference based on Anti-Doped N-Channel MOSFETs," by Mohammad Al-Shyoukh et al, Proceedings of the IEEE 2014 Custom Integrated Circuits Conference, Sep. 15, 2014, 4 pgs.

"An Ultra-Low-Power, Temperature Compensated Voltage Reference Generator," by Giuseppe De Vita et al., Proceedings of the IEEE 2005 Custom Integrated Circuits Conference, Sep. 21, 2005, pp. 751-754.

\* cited by examiner

LOW POWER INPUT BUFFER USING FLIPPED GATE MOS

TECHNICAL FIELD

This disclosure relates generally to integrated circuit input buffer circuits. More particularly, this disclosure relates to integrated circuit input buffer circuits with dual reference voltages, wherein the dual reference voltages are generated by a reference voltage generator circuit employing a flipped gate anti-doped transistor.

BACKGROUND

Logic voltage level translation is required in many electronic systems. One integrated circuit may be operating at a lower power supply voltage level (e.g. 1.2V, 1.5V or 3.3V, etc.) while a second integrated circuit may be operating at much higher voltage level (e.g. 5.0V). When the integrated circuits communicate with each other, the voltage levels of the driving integrated circuit must be compatible with the threshold voltages of the receiving integrated circuit. These threshold values differ based on the amplitude of the power supply voltage sources of the two integrated circuits. When the integrated circuits communicate with each other and have differing power supply voltage levels, a level-translation solution is needed. The output driver level for a high or logic 1 output must be greater than the threshold level of the receiver input level for the input to receive the high input level or logic 1. The output driver level for a low or logic 0 output must be less than the threshold level of the receiver input level for the input to receive the low input level or logic 0. Further, the output driver levels must meet the tolerance variations of the receiver even when the driver is at its extremes of tolerance.

FIGS. 1 and 2 illustrate a driver and receiver of an inter-chip connection between first integrated circuit chip 5 and a second integrated circuit chip 15 of the prior art. A microcontroller is placed on the first integrated circuit chip 5 and is powered by a low power supply voltage source $V_{DD\_IO}$ (e.g. 1.5V). An output signal of the microcontroller of the first integrated circuit chip 5 is applied to a driver circuit 10. The output of the driver circuit 10 is connected to wiring. The wiring is then connected to an input of the second integrated circuit chip 15 that has a high power supply voltage source $V_{DD}$ (e.g. 5V). An input buffer 20 acts as a receiver for the integrated circuit chip 15. The input buffer, as shown in FIG. 2, consists of a CMOS inverter circuit 22. The CMOS inverter circuit 22 has an NMOS transistor $M_{N1}$ and a PMOS transistor $M_{P1}$. The gates of the NMOS transistor $M_{N1}$ and a PMOS transistor $M_{P1}$ are connected together and to the input of the connection from the wiring between the first integrated circuit chip 5 and a second integrated circuit chip 15. The source of the PMOS transistor $M_{P1}$ is connected to the power supply voltage source $V_{DD}$ and the source of the NMOS transistor $M_{N1}$ is connected to the substrate of the integrated circuit chip 15 that is usually the ground reference source. The drains of the NMOS transistor $M_{N1}$ and a PMOS transistor $M_{P1}$ are connected together and to the input of the of the inverter circuit 24. In most instances the inverter circuit 24 is equivalent to the CMOS inverter circuit 22.

When the driver 10 is set to a logical 0 or a low output state, the NMOS transistor $M_{N1}$ is turned off and the PMOS transistor $M_{P1}$ is turned on and the output of the inverter circuit 22 is at a logical 1 or a high output state. When the driver 10 begins to change from the low output state to the high output state, the output voltage begins to rise. The NMOS transistor $M_{N1}$ begins to turn on and the PMOS transistor $M_{P1}$ begins to turn off. As the amplitude of the output of the driver 10 rises to its maximum amplitude and the NMOS transistor $M_{N1}$ is turned on to saturation. However, the maximum voltage of the high level of the driver 10 may not be sufficient to turn off the PMOS transistor $M_{P1}$ and a shoot through current is transferred through the PMOS transistor $M_{P1}$ and the NMOS transistor $M_{N1}$. The shoot through current maybe excessive and cause damage or are a waste of power.

FIGS. 3 and 4 are schematics illustrating an example of a solution to the shoot through problem described in FIGS. 1 and 2 of the prior art. Referring to FIG. 3, The receiver 25 includes an input buffer 30 that receives the input voltage $V_{IN}$ at its input. The input buffer 30 is connected to a low power supply voltage source $V_{DD\_IO}$ that has the same amplitude as that connected to the first integrated circuit chip 5 of FIG. 1. The receiver is also connected to the ground reference source. The input buffer is configured to have output voltage levels that range from approximately the ground reference level and approximately the voltage level of the low power supply voltage source $V_{DD\_IO}$. The output of the input buffer is connected to an input of a level shifter 35. The level shifter 35 is connected to the low power supply voltage source $V_{DD\_IO}$ and the high power supply voltage source $V_{DD}$. A level shifter circuit is known in the art to be configured for shifting an amplitude swing of a signal to an amplitude swing of a larger range. Adding the low power supply voltage source $V_{DD\_IO}$ externally to the second integrated circuit chip increases die cost, pin count and PCB traces.

In FIG. 4, the input buffer 30 has an NMOS transistor $M_{N2}$ and a PMOS transistor $M_{P2}$. The gates of the NMOS transistor $M_{N2}$ and a PMOS transistor $M_{P2}$ are connected together and to the input of the connection from the wiring between the first integrated circuit chip 5 and a second integrated circuit chip 15. The source of the PMOS transistor $M_{P2}$ is connected to the low drop out power supply 40 to receive the low power supply voltage VDD_IO and the source of the NMOS transistor $M_{N2}$ is connected to the ground reference source. The drains of the NMOS transistor $M_{N2}$ and a PMOS transistor $M_{P2}$ are connected together and to the input of the of the level shifter 35. The level shifter 35 shifts the amplitude of the output of the buffer from the swing from the ground reference level to that of the low power supply voltage source $V_{DD\_IO}$ to a voltage swing from the ground reference level to that of the low power supply voltage source $V_{DD}$.

The low drop out power supply 40 generates the low power supply voltage $V_{DD\_IO}$ for application to the input buffer and the level shifter 35. The low drop out power supply 40 the low power supply voltage VDD_IO is generated internally to save pin count. This low drop out power supply 40 has to manage transient current of input buffer 30 and level shifter 35. The design of low drop out power supply 40 is more difficult if a large capacitor on low power supply voltage source $V_{DD\_IO}$ is not allowed. And the additional power for low drop out power supply 40 could be large.

FIG. 5 is a schematic diagram of an input receiver capable of alleviating shoot through of the prior art. The input receiver has a number of PMOS transistors $M_{P3}$, $M_{P4}$, and $M_{P5}$ connected in series. The source of the first PMOS transistor $M_{P3}$ is connected to the power supply voltage source $V_{DD}$. The drain of the last PMOS transistor $M_{P5}$ is connected to the drain of the NMOS transistor $M_{N3}$. The source of the NMOS transistor $M_{N3}$ is connected to the ground reference source. The gates of the PMOS transistors $M_{P3}$, $M_{P4}$, $M_{P5}$, and the NMOS transistor $M_{N3}$ are connected together and to the input of the integrated circuit to receive the input voltage $V_{IN}$. The connection between the drains of the PMOS transistor $M_{P5}$, and the NMOS transistor $M_{N3}$ is connected to the input of the inverter 50. While the shoot through is not eliminated, it may be lowered to an acceptable level.

SUMMARY

An object of this disclosure is to provide integrated circuit input buffer circuit providing an interface between integrated circuits having differing power supply voltage sources.

Another object of this disclosure is to provide integrated circuit input buffer circuit having dual reference voltages.

Further, another object of this disclosure is to provide a dual reference voltage generator circuit employing a flipped gate anti-doped transistor.

Another object of this disclosure is to provide an integrated circuit input buffer with no shoot through current.

To accomplish at least one of these objects, an input buffer includes a dual reference voltage generator circuit and a receiver circuit that are configured to function with a high power supply voltage source. The dual reference voltage generator circuit is connected to the input buffer circuit that is configured to receive a first voltage range and translate the first input voltage range to a second voltage range. The dual reference voltage generator has a current source, a normal NMOS transistor, and a flipped-gate anti-doped NMOS transistor connected between a power supply voltage source and the ground reference source. A first terminal of the current source is connected to a power supply. The second terminal of the current source is connected to a gate and drain of the normal NMOS transistor and to a first output terminal of the dual reference voltage generator circuit that provides the first reference voltage. A source of the normal NMOS transistor is connected to a drain of the flipped-gate anti-doped NMOS transistor and to a second output terminal of the dual reference voltage generator circuit that provides the second reference voltage. The flipped-gate anti-doped NMOS transistor has a source connected to a ground reference source. The gate of the flipped-gate anti-doped NMOS transistor is connected to the gate of the normal transistor and the second terminal of the current source.

The first reference voltage of the dual reference voltage generator circuit is determined to be the threshold voltage of the flipped-gate anti-doped NMOS transistor. The second reference voltage of the dual reference voltage generator circuit is determined to be the threshold voltage of the flipped-gate anti-doped NMOS transistor less the threshold voltage of the normal NMOS transistor or the bandgap of silicon.

The receiver is connected to receive the first reference voltage and the second reference voltage from the dual reference voltage generator circuit and the input voltage signal from an integrated circuit operating with a low power supply voltage source and transmitting with the first voltage range. The receiver has a first comparator, a second comparator, and a latching circuit. The first comparator connected to receive the input voltage and the first reference voltage, and the second comparator is connected to receive the input voltage and the second reference voltage. The latching circuit is connected to an output of the first comparator and to an output of the second comparator and to an input of an inverter circuit. The output of the inverter circuit is connected to provide the data output signal from the input buffer.

The first comparator includes a first NMOS transistor with a source connected to receive the input voltage signal. The gate of the first NMOS transistor is connected to receive the first reference voltage. The drain of the first NMOS transistor connected to the latching circuit.

The second comparator includes a differential pair of transistors wherein the input voltage signal is connected to a gate of a first NMOS transistor of the differential pair of transistors and the second reference voltage is connected to a gate of a second NMOS transistor of the differential pair of transistors. The sources of the first and second NMOS transistors are connected together and to a tail current source. The tail current source is connected to the ground reference source. The tail current source is formed of a third NMOS transistor with the gate connected to receive the input voltage signal and the source connected to the ground reference source. The drain of the third NMOS transistor is connected to the coupled sources of the first and second NMOS transistors. The gate of the third NMOS is connected to receive the input voltage signal.

The drain of the first NMOS transistor of the differential pair of transistors is connected to a mirror leg of a current mirror and to the latching circuit. The drain of the second NMOS transistor of the differential pair of transistors is connected to a source of a gating NMOS transistor. The gate of the gating NMOS transistor is connected to drain of the first NMOS transistor of the differential pair of transistors. The drain of the gating NMOS transistor is connected to a reference leg of the current mirror.

The current mirror is formed with a first PMOS transistor and a second PMOS transistor. The sources of the first PMOS transistor and the second PMOS transistor are connected together to the power supply voltage source. The gates of the first PMOS transistor and the second PMOS transistor are connected together and connected to the drain of the second PMOS transistor and thus to the drain of the gating transistor to form the reference leg of the current mirror. The drain of the first PMOS transistor is connected to form the output of the second comparator.

The latching circuit is formed of a third PMOS transistor and a fourth PMOS transistor. The sources of the third PMOS transistor and the fourth PMOS transistor are connected together to the power supply voltage source. The gate of the third PMOS transistor is connected to the drain of the fourth PMOS transistor and to the output of the second comparator and the input of the inverter. The gate of the fourth PMOS transistor is connected to the drain of the third PMOS transistor and to the output of the first comparator.

The input buffer has an inverter circuit with an input connected to the output of the latching circuit and the second comparator. The inverter circuit receives the output signal of the latching circuit and the second comparator and inverts and conditions the signal for transfer to external circuits.

When the output of the inverter is set to a logical 0 or a low output state, the first comparator is inactive with the connection between the first comparator and the latching circuit is set to the low output state. The second comparator is active with the connection between the second comparator and the latching circuit being set to a logical 1 or a high output state. The second comparator compares input voltage signal with the second reference voltage. The tail current source does not generate any static current as long as the input voltage signal is less than the threshold voltage of the third NMOS transistor. When the input voltage signal reaches a voltage level greater than the second reference voltage, the second NMOS transistor of the differential pair of transistors is deactivated and the first NMOS transistor of the differential pair of transistors is activated and the output of the latching circuit and the second comparator is set to low output state. The output of the inverter circuit is set to the high state.

When the output of the inverter is set to the logical 1 or the high output state, the first comparator is active with the connection between the first comparator and the latching circuit is set to the high output state. The second comparator is inactive with the connection between the second comparator and the latching circuit being set to a logical 0 or a low output state. The first comparator compares input voltage signal with the first reference voltage less a threshold voltage of the first transistor of the first comparator. There is no static current generated as long as the input voltage signal is greater than the first reference voltage less a threshold voltage of the first transistor of the first comparator. When the input signal becomes less than the first reference voltage less a threshold voltage of the first transistor of the first comparator, the first comparator is deactivated and the first transistor of the first comparator is turned on and the connection between the first comparator and the latching circuit is set to the low output state and the output of the latching circuit and second comparator are set to the high output state. The output of the inverter then becomes set to the low output state.

The input high voltage threshold is determined as the threshold voltage of the flipped gate anti-doped transistor less the threshold of the normal NMOS transistor of the reference voltage generator. This value is equal to the bandgap voltage of silicon or another semiconductor material. The input low voltage level is determined as a threshold voltage of the flipped gate anti-doped transistor less the threshold voltage of the first transistor of the first comparator of the receiver. This value is equal to the bandgap voltage of silicon less a hysteresis voltage.

In various embodiments that accomplish at least one of these objects, a method for operation of a receiver starts with generating a first reference voltage dependent upon a threshold voltage of the flipped gate anti-doped transistor. A second reference voltage is generated dependent upon a difference between a standard or normal NMOS transistor and a threshold voltage of the flipped gate anti-doped transistor. The input voltage signal is received. The output of the receiver is determined to be set to either a high output state or a low output state.

When the output of the receiver is in the high output state, the input voltage signal is then compared with the first reference voltage signal. When the input voltage state is less than the first reference voltage less a threshold voltage of threshold voltage of a comparison device or the bandgap of silicon, the output of the receiver is set to the low output state. When the input signal voltage is not less than the first reference voltage less a threshold voltage of a comparison circuit comparing the input signal voltage and the first reference voltage, the output is not changed and a next sampling of the input voltage signal is captured for comparing with the first reference voltage signal.

When the output of the receiver is in the low output state, the input voltage signal is then compared with the second reference voltage signal. When the input voltage state is greater than the second reference voltage signal, the output of the receiver is set to the high output state. When the input signal voltage is not greater than the second reference voltage, the output is not changed and a next sampling of the input voltage signal is captured for comparing with the second reference voltage signal.

DETAILED DESCRIPTION

The essential features that embody the principals of this disclosure include a dual reference voltage input buffer with a receiver block that has two comparison circuits configured to define the rise and fall threshold voltages of the receiver. One comparison circuit is a differential pair of transistors that compares if an input voltage signal is greater than a rising threshold voltage. The second comparison circuit is a single NMOS transistor that determines if the input voltage signal is less than the falling threshold voltage. In the dual comparison circuits, the dual reference voltages each connect to a gate of an NMOS transistor such that no current flow from the reference. The dual reference voltage input buffer has dual reference voltage generator that includes an anti-doped flipped-gate transistor that generates the dual reference voltages with very low power consumption.

Figure 1:
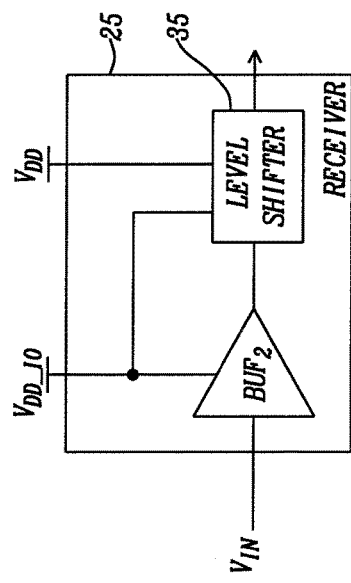
FIGS. 1 and 2 illustrate an inter-chip connection between first integrated circuit chip and a second integrated circuit chip of the prior art.
Figure 2:
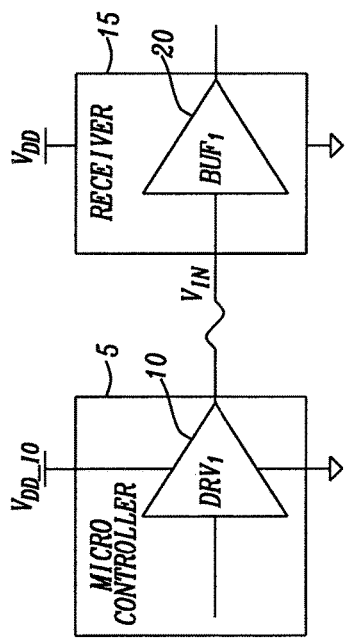
Figure 3:
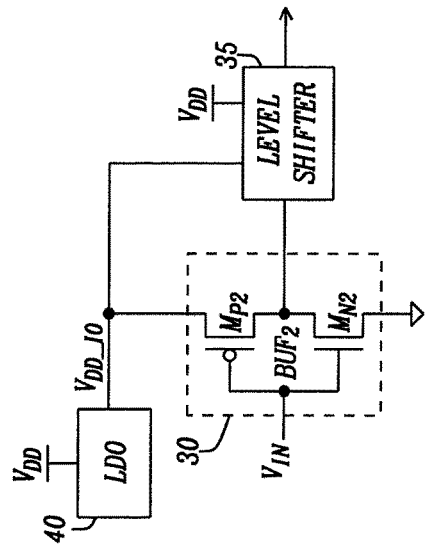
FIGS. 3 and 4 are schematics illustrating examples of a solution to the shoot through problem for a driver and receiver of an inter-chip connection between a first integrated circuit chip and a second integrated circuit chip of the prior art.
Figure 4:
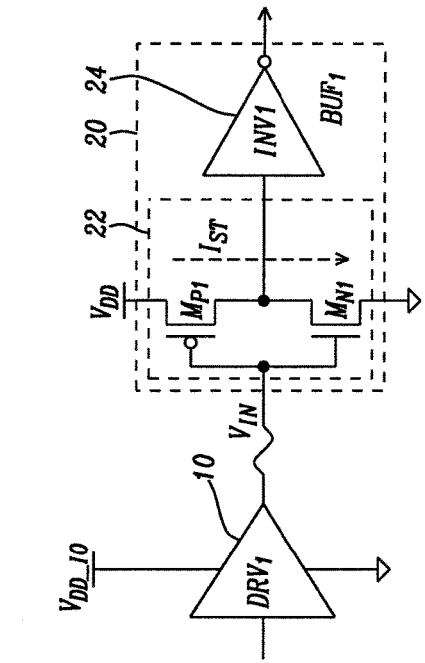
Figure 5:
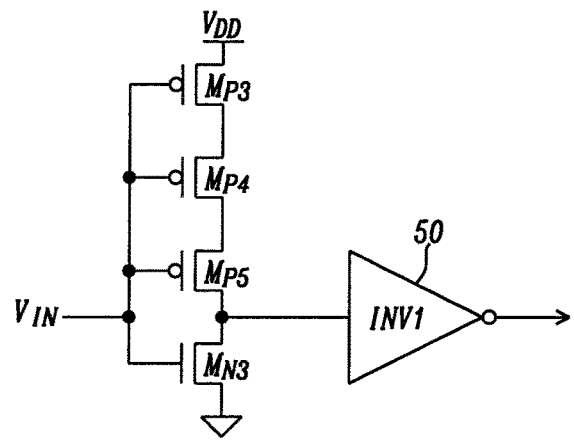
FIG. 5 is a schematic diagram of an input receiver capable of alleviating shoot through of the prior art.
Figure 6A:
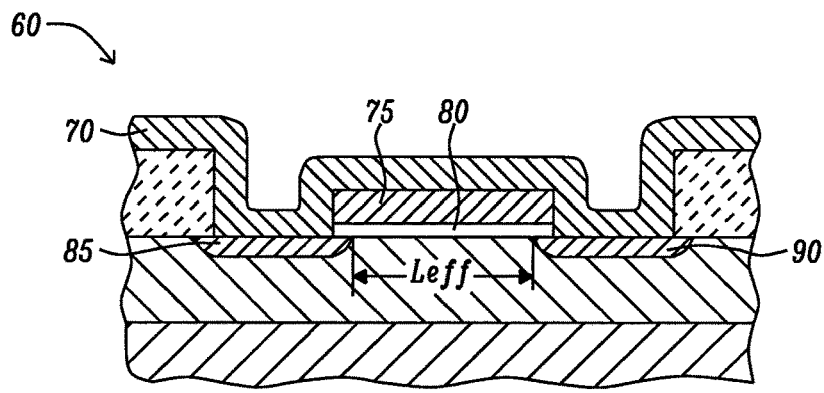
FIG. 6a is a cross sectional diagram of a MOS transistor of the related art.
Figure 6B:
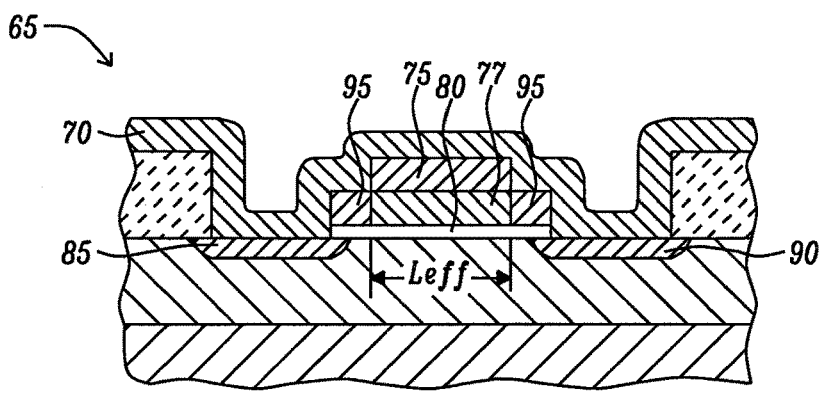
FIG. 6b is a cross sectional diagram of a Flipped-Gate MOS transistor of the related art.

FIGS. 6a and 6b are a cross sectional diagrams respectively of a MOS transistor and a flipped-gate anti-doped NMOS transistor of the related art. In the related art as shown in FIGS. 6a and 6b, a flipped-gate anti-doped transistor (FIG. 6b) has a threshold voltage that is greater than the threshold voltage of a normal transistor. The normal transistor is defined is one that employs the standard processing currently in practice and is similar to that shown in FIG. 6a. "MOS voltage reference based on polysilicon gate work function difference," Oguey, et al., IEEE Journal of Solid-State Circuits, vol. 15, no. 3, pp. 264-269, June 1980 shows in FIGS. 3a and 3b and reproduced in FIGS. 6a and 6b. Quoting from Oguey et al., FIG. 3a (FIG. 6a of the present disclosure) shows a standard n-channel transistor 60 with an n-type gate 75 and FIG. 3b (FIG. 6b of the present disclosure) modified n-channel transistor 65 with a p-type gate 77 fabricated with a technology that uses doped oxides as diffusion sources. In the standard transistor 60, gate 75, drain 90, and source 85 are surrounded by a phosphorus-doped oxide 75. Source 85 and drain 90 are self-aligned with the gate 75. Effective channel length Leff is gate length minus two lateral diffusion lengths. In the modified transistor 65, the center part of the gate 77 is p-doped by leaving above it a region of boron-doped oxide 75. This structure behaves like a higher threshold transistor of channel length Leff in series with two short-channel low-threshold transistors. The additional transistors 95 produce a negligible effect in weak inversion but contribute to a larger change in gate threshold voltage at higher current levels.

Figure 7:
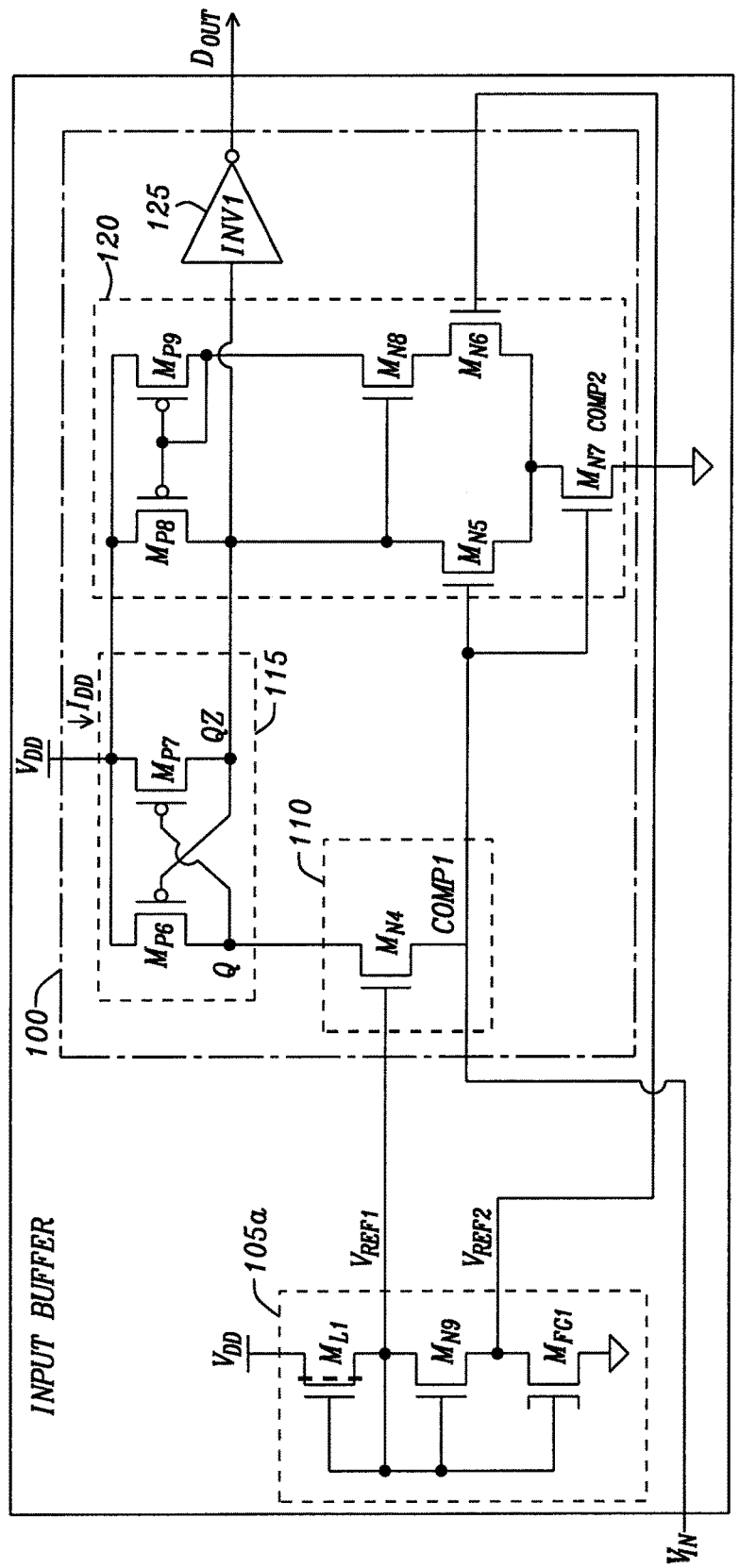
FIG. 7 is a schematic illustrating an input buffer embodying the principals of the present disclosure.

FIG. 7 is a schematic illustrating an input buffer embodying the principals of the present disclosure. The input buffer includes a dual reference voltage generator circuit 105a and a receiver circuit 100 that are configured to function with a high power supply voltage source $V_{DD}$. The input buffer circuit is configured to receive an input voltage signal $V_{IN}$ that has a first voltage range and translates the first voltage range to a second voltage range of the output $D_{OUT}$ of the receiver circuit 100.

The dual reference voltage generator 105a has a low threshold voltage NMOS transistor $M_{L1}$, a normal NMOS transistor $M_{N9}$, and a flipped-gate anti-doped NMOS transistor $M_{FG1}$ connected between a power supply voltage source $V_{DD}$ and the ground reference source. The drain of the low threshold voltage NMOS transistor $M_{L1}$ is connected to power supply voltage source $V_{DD}$. The gate and source of the low threshold voltage NMOS transistor $M_{L1}$ is connected to a gate and drain of the normal NMOS transistor $M_{N9}$ and to a first output terminal of the dual reference voltage generator circuit that provides the first reference voltage $V_{REF1}$. A source of the normal NMOS transistor $M_{N9}$ is connected to a drain of the flipped-gate anti-doped NMOS transistor $M_{FG1}$ and to a second output terminal of the dual reference voltage generator circuit that provides the second reference voltage $V_{REF2}$. The flipped-gate anti-doped NMOS transistor $M_{FG1}$ has a source connected to a ground reference source. The gate of the flipped-gate anti-doped NMOS transistor $M_{FG1}$ is connected to the gates of the normal transistor $M_{N9}$ and the gate and drain of the normal NMOS transistor $M_{N9}$ and to a first output terminal of the dual reference voltage generator circuit that provides the first reference voltage $V_{REF1}$.

The first reference voltage $V_{REF1}$ of the dual reference voltage generator circuit 105a is determined to be the threshold voltage of the flipped-gate anti-doped NMOS transistor $M_{FG1}$. The second reference voltage $V_{REF2}$ of the dual reference voltage generator circuit 105a is determined to be the threshold voltage of the flipped-gate anti-doped NMOS transistor $M_{FG1}$ less the threshold voltage of the normal NMOS transistor $M_{N9}$ or the bandgap of silicon.

The receiver 100 is connected to receive the first reference voltage $V_{REF1}$ and the second reference voltage $V_{REF2}$ from the dual reference voltage generator circuit 105a and the input voltage signal $V_{IN}$ from an integrated circuit operating with a low power supply voltage source and transmitting with the first voltage range. The receiver 100 has a first comparator 110, a second comparator 120, and a latching circuit 115. The first comparator 110 connected to receive the input voltage $V_{IN}$ and the first reference voltage $V_{REF1}$ and the second comparator 120 is connected to receive the input voltage $V_{IN}$ and the second reference voltage $V_{REF2}$. The latching circuit 115 is connected to an output of the first comparator 110 and to an output of the second comparator 120 and to an input of an inverter circuit 125. The output of the inverter 125 circuit is connected to transmit the data output signal $D_{OUT}$ from the input buffer 100.

The first comparator 110 includes an NMOS transistor $M_{N4}$ with a source connected to receive the input voltage signal $V_{IN}$. The gate of the NMOS transistor $M_{N4}$ is connected to receive the first reference voltage $V_{REF1}$. The drain of the NMOS transistor $M_{N4}$ connected to the latching circuit 115.

The second comparator 120 includes a differential pair of transistors $M_{N5}$ and $M_{N6}$ wherein the input voltage signal $V_{IN}$ is connected to a gate of the NMOS transistor MN5 and the second reference voltage $V_{REF2}$ is connected to a gate of a second NMOS transistor $M_{N6}$. The sources of the NMOS transistors $M_{N5}$ and $M_{N6}$ are connected together and to a tail current source. The tail current source is connected to the ground reference source. The tail current source is formed of an NMOS transistor $M_{N7}$ with the gate connected to receive the input voltage signal $V_{IN}$ and the source connected to the ground reference source. The drain of the NMOS transistor $M_{N7}$ is connected to the coupled sources of the NMOS transistors $M_{N5}$ and $M_{N6}$. The gate of the NMOS $M_{N7}$ is connected to receive the input voltage signal $V_{IN}$.

The drain of the NMOS transistor $M_{N5}$ of the differential pair of transistors is connected to a mirror leg of a current mirror and to the latching circuit 115. The drain of the NMOS transistor $M_{N6}$ of the differential pair of transistors is connected to a source of a gating NMOS transistor $M_{N8}$. The gate of the gating NMOS transistor $M_{N8}$ is connected to drain of the NMOS transistor $M_{N5}$ of the differential pair of transistors. The drain of the gating NMOS transistor $M_{N8}$ is connected to a reference leg of the current mirror.

The current mirror is formed a PMOS transistor $M_{P8}$ and a PMOS transistor $M_{P9}$. The sources of the PMOS transistor $M_{P8}$ and the PMOS transistor $M_{P9}$ are connected together to the power supply voltage source $V_{DD}$. The gates of the PMOS transistor $M_{P8}$ and the PMOS transistor $M_{P9}$ are connected together and connected to the drain of the PMOS transistor $M_{P9}$ and thus to the drain of the gating transistor $M_{N8}$ to form the reference leg of the current mirror. The drain of the first PMOS transistor $M_{P8}$ is connected to form the output of the second comparator that is connected to the output of the latching circuit 115.

The latching circuit 115 is formed of a PMOS transistor $M_{P6}$ and a PMOS transistor $M_{P7}$. The sources of the PMOS transistor $M_{P6}$ and the PMOS transistor $M_{P7}$ are connected together to the power supply voltage source $V_{DD}$. The gate of the PMOS transistor $M_{P6}$ is connected to the drain of the fourth PMOS transistor $M_{P7}$ and to the output of the second comparator and the input of the inverter 125. The gate of the PMOS transistor $M_{P7}$ is connected to the drain of the third PMOS transistor $M_{P6}$ and to the output of the first comparator 110.

The input buffer has an inverter circuit 125 with an input connected to the output of the latching circuit 115 and the second comparator 120. The inverter circuit 125 receives the output signal of the latching circuit 115 and the second comparator 120 and inverts and conditions the output signal $D_{OUT}$ for transfer to external circuits.

When the output of the inverter 125 is at is set to a logical 0 or a low output state, the first comparator 110 is inactive with the connection Q between the first comparator 110 and the latching circuit 115 set to the low output state. The second comparator 120 is active with the connection QZ between the second comparator 120 and the latching circuit 115 being set to a logical 1 or a high output state. The second comparator 120 compares input voltage signal $V_{IN}$ with the second reference voltage $V_{REF2}$. The tail current source $M_{N7}$ does not generate any static current as long as the input voltage signal $V_{IN}$ is less than the threshold voltage of the NMOS transistor $M_{N7}$. When the input voltage signal $V_{IN}$ reaches a voltage level greater than the second reference voltage $V_{REF2}$, the NMOS transistor $M_{N6}$ is deactivated and the NMOS transistor $M_{N5}$ is activated and the output of the latching circuit 115 and the second comparator 120 is set to low output state. The output of the inverter circuit 125 is set to the high state.

When the output of the inverter 125 is at is set to the logical 1 or the high output state, the first comparator 110 is active with the connection Q between the first comparator 110 and the latching circuit 115 set to the high output state. The second comparator 120 is inactive with the connection QZ between the second comparator 120 and the latching circuit 115 being set to a logical 0 or a low output state. The first comparator 110 compares input voltage signal $V_{IN}$ with the first reference voltage $V_{REF1}$ less a threshold voltage of the transistor $M_{N4}$ of the first comparator 110. The no static current generated as long as the input voltage signal $V_{IN}$ is greater than the first reference voltage $V_{REF1}$ less a threshold voltage of the transistor $M_{N4}$. When the input signal $V_{IN}$ becomes less than the first reference voltage $V_{REF1}$ less a threshold voltage of the transistor $M_{N4}$, the first comparator 110 is deactivated and the transistor $M_{N4}$ is turned on and the connection Q between the first comparator 110 and the latching circuit 115 is set to the low output state and the output of the latching circuit 115 and second comparator 120 are set to the high output state. The output of the inverter 125 then becomes set to the low output state.

The input high voltage threshold ($V_{IH}$) is determined as the threshold voltage of the flipped gate anti-doped transistor $M_{FG1}$ less the threshold of the normal NMOS transistor $M_{N9}$ of the reference voltage generator. This value is equal to the bandgap voltage of silicon or another semiconductor material. The input low voltage level ($V_{IL}$) is determined as a threshold voltage of the flipped gate anti-doped transistor $M_{FG1}$ less the threshold voltage of the transistor $M_{N4}$ of the first comparator 110. This value is equal to the bandgap voltage of silicon less a hysteresis voltage.

Figure 8A:
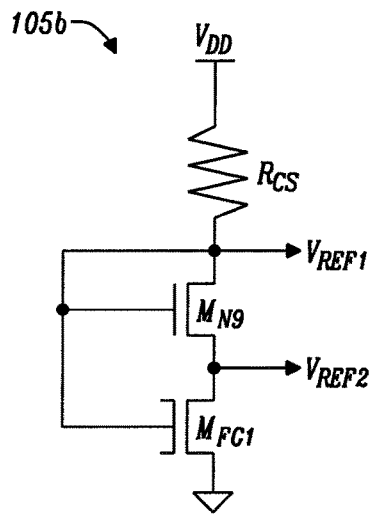
FIGS. 8A and 8B are schematics of various implementations of a reference voltage generator of an input buffer embodying the principals of the present disclosure.
Figure 8B:
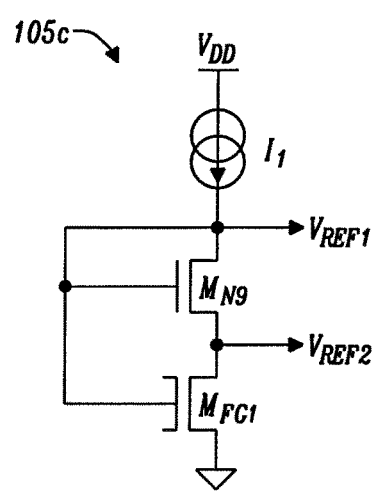

FIGS. 8A and 8B are schematics of various implementations of a reference voltage generator of an input buffer embodying the principals of the present disclosure. In FIG. 8A, the structure of the low threshold NMOS transistor $M_{L1}$ of FIG. 7 is replaced with a resistor $R_{CS}$. The resistor $R_{CS}$ is chosen such that the current through the resistor is approximately equal to the subthreshold leakage of the low threshold NMOS transistor $M_{L1}$.

In FIG. 8B, the structure of the low threshold NMOS transistor $M_{L1}$ of FIG. 7 is replaced with a current source $I_1$. The current source is structured such that the current through the current source $I_1$ is approximately equal to the subthreshold leakage of the low threshold NMOS transistor $M_{L1}$.

Figure 9:
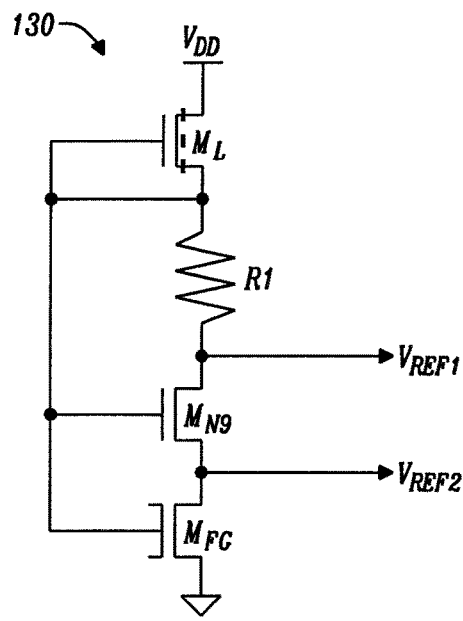
FIGS. 9 and 10 are schematics of various implementations of a reference voltage generator showing hysteresis of an input buffer embodying the principals of the present disclosure.
Figure 10:
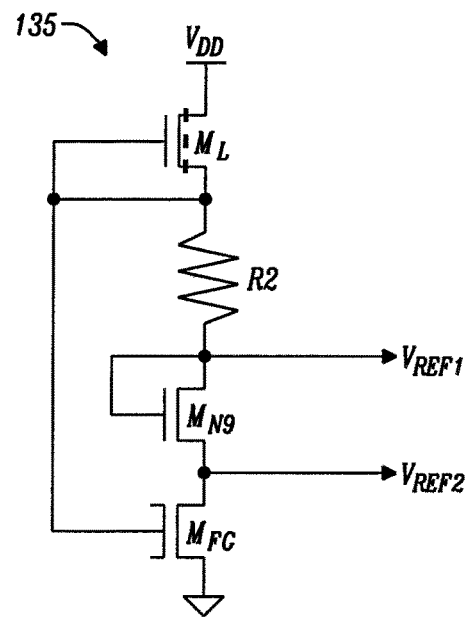

FIGS. 9 and 10 are schematics of various implementations of a dual voltage reference voltage generator showing hysteresis of an input buffer embodying the principals of the present disclosure. In FIG. 9, the reference voltage generator 130 has a low threshold voltage NMOS transistor $M_{L1}$, a resistor $R_1$, a normal NMOS transistor $M_{N9}$, and a flipped-gate anti-doped NMOS transistor $M_{FG1}$ connected between a power supply voltage source $V_{DD}$ and the ground reference source. The drain of the low threshold voltage NMOS transistor $M_{L1}$ is connected to power supply voltage source $V_{DD}$. The gate and source of the low threshold voltage NMOS transistor $M_{L1}$ is connected to a first terminal of the resistor $R_1$ and to the gate of the normal NMOS transistor $M_{N9}$ and the gate of the flipped-gate anti-doped NMOS transistor $M_{FG1}$. The second terminal of the resistor $R_1$ is connected to the drain of the normal transistor $M_{N9}$ and to a first output terminal of the dual reference voltage generator circuit that provides the first reference voltage $V_{REF1}$.

A source of the normal NMOS transistor $M_{N9}$ is connected to a drain of the flipped-gate anti-doped NMOS transistor $M_{FG1}$ and to a second output terminal of the dual reference voltage generator circuit that provides the second reference voltage $V_{REF2}$. The flipped-gate anti-doped NMOS transistor $M_{FG1}$ has a source connected to a ground reference source.

The first reference voltage $V_{REF1}$ of the dual reference voltage generator circuit 105a is determined to be the threshold voltage of the flipped-gate anti-doped NMOS transistor $M_{FG1}$ and the voltage drop across the resistor $R_1$. This lowers the first reference voltage $V_{REF1}$ by the voltage drop across the resistor $R_1$. This voltage drop across the low threshold voltage NMOS transistor $M_{L1}$ is determined by the product of the subthreshold leakage current of the low threshold voltage NMOS transistor $M_{L1}$ and the value of the resistance of the resistor $R_1$. The second reference voltage $V_{REF2}$ of the dual reference voltage generator circuit 130 is determined to be the threshold voltage of the flipped-gate anti-doped NMOS transistor $M_{FG1}$ less the threshold voltage of the normal NMOS transistor $M_{N9}$ or the bandgap of silicon. The lowering of the first reference voltage $V_{REF1}$ lowers the input low voltage level ($V_{IL}$) while input high voltage threshold ($V_{IH}$) is unchanged, thus increasing the hysteresis of the buffer.

In FIG. 10, the reference voltage generator 135 has a low threshold voltage NMOS transistor $M_{L1}$, a resistor $R_2$, a normal NMOS transistor $M_{N9}$, and a flipped-gate anti-doped NMOS transistor $M_{FG1}$ connected between a power supply voltage source $V_{DD}$ and the ground reference source. The drain of the low threshold voltage NMOS transistor $M_{L1}$ is connected to power supply voltage source $V_{DD}$. The gate and source of the low threshold voltage NMOS transistor $M_{L1}$ is connected to a first terminal of the resistor $R_1$ and the gate of the flipped-gate anti-doped NMOS transistor $M_{FG1}$. The second terminal of the resistor $R_1$ is connected to the gate and drain of the normal transistor $M_{N9}$ and to a first output terminal of the dual reference voltage generator circuit that provides the first reference voltage $V_{REF1}$.

A source of the normal NMOS transistor $M_{N9}$ is connected to a drain of the flipped-gate anti-doped NMOS transistor $M_{FG1}$ and to a second output terminal of the dual reference voltage generator circuit that provides the second reference voltage $V_{REF2}$. The flipped-gate anti-doped NMOS transistor $M_{FG1}$ has a source connected to a ground reference source.

The first reference voltage $V_{REF1}$ of the dual reference voltage generator circuit 105a is determined to be the threshold voltage of the flipped-gate anti-doped NMOS transistor $M_{FG1}$ and the voltage drop across the resistor $R_2$. This lowers the first reference voltage $V_{REF1}$ by the voltage drop across the resistor $R_1$. This voltage drop across the low threshold voltage NMOS transistor $M_{L1}$ is determined by the product of the subthreshold leakage current of the low threshold voltage NMOS transistor $M_{L1}$ and the value of the resistance of the resistor $R_s$. The second reference voltage $V_{REF2}$ of the dual reference voltage generator circuit 130 is determined to be the threshold voltage of the flipped-gate anti-doped NMOS transistor $M_{FG1}$. The level of the first reference voltage $V_{REF1}$ and the second reference voltage $V_{REF2}$ of the dual reference voltage generator circuit 135 are set such that an integrated circuit operating with a low power supply voltage $V_{DD\_IO}$ and transmitting with the first voltage range are receivable in that the input low voltage level $(V_{IL})$ and the input high voltage threshold $(V_{IH})$ are both lowered.

Figure 11:
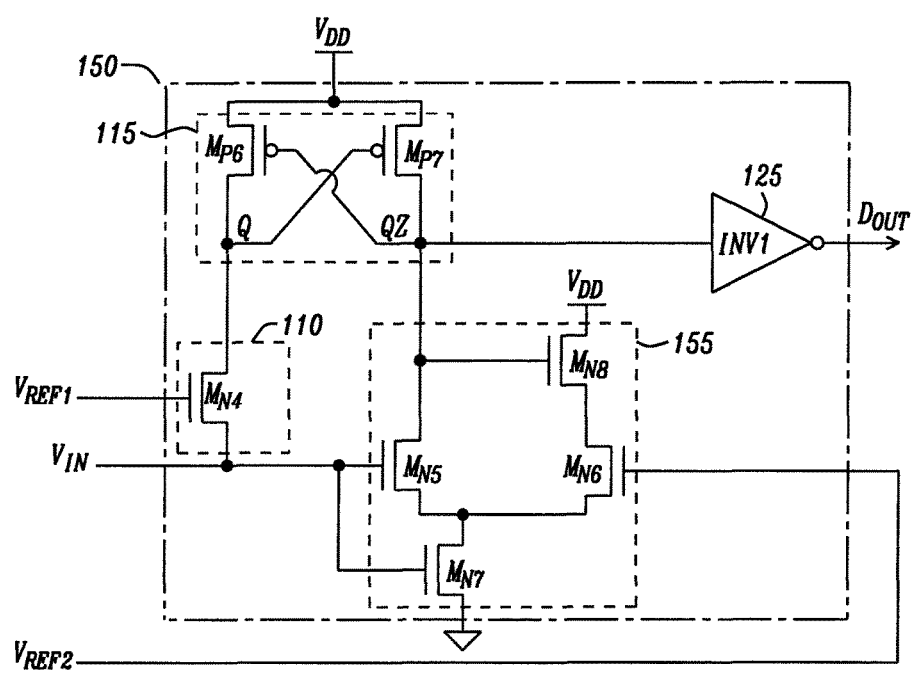
FIG. 11 is a schematic illustrating a second implementation of a receiver of an input buffer embodying the principals of the present disclosure.

FIG. 11 is a schematic illustrating a second implementation of a receiver 150 of an input buffer embodying the principals of the present disclosure. The receiver 130 is connected to receive the first reference voltage $V_{REF1}$ and the second reference voltage $V_{REF2}$ from the dual reference voltage generator circuit 105a of FIG. 7, 105b of FIG. 8A, 105c of FIG. 8B, 130 of FIG. 9, or 135 of FIG. 10. The receiver 130 is also connected to receive the input voltage signal $V_{IN}$ from an integrated circuit operating with a low power supply voltage source and transmitting with the first voltage range. The receiver 130 has a first comparator 110, a second comparator 155, and a latching circuit 115. The first comparator 110, the latching circuit 115, and inverter circuit 125 are structured and operate as described in FIG. 7.

The second comparator 155 is connected to receive the input voltage $V_{IN}$ and the second reference voltage $V_{REF2}$. The second comparator 155 includes a differential pair of transistors $M_{N5}$ and $M_{N6}$ wherein the input voltage signal $V_{IN}$ is connected to a gate of the NMOS transistor $M_{N5}$ and the second reference voltage $V_{REF2}$ is connected to a gate of a second NMOS transistor $M_{N6}$. The sources of the NMOS transistors $M_{N5}$ and $M_{N6}$ are connected together and to a tail current source. The tail current source is connected to the ground reference source. The tail current source is formed of an NMOS transistor $M_{N7}$ with the gate connected to receive the input voltage signal $V_{IN}$ and the source connected to the ground reference source. The drain of the NMOS transistor $M_{N7}$ is connected to the coupled sources of the NMOS transistors $M_{N5}$ and $M_{N6}$. The gate of the NMOS $M_{N7}$ is connected to receive the input voltage signal $V_{IN}$.

The drain of the NMOS transistor $M_{N5}$ of the differential pair of transistors is connected to the latching circuit 115. The drain of the NMOS transistor $M_{N6}$ of the differential pair of transistors is connected to a source of a gating NMOS transistor $M_{N8}$. The gate of the gating NMOS transistor $M_{N8}$ is connected to drain of the NMOS transistor $M_{N5}$ of the differential pair of transistors. The drain of the gating NMOS transistor $M_{N8}$ is connected to the power supply voltage source $V_{DD}$.

The drain of the PMOS transistor $M_{P7}$ is connected to the gate of the PMOS transistor $M_{P6}$ and to the output of the second comparator and the input of the inverter 125. The inverter circuit 125 receives the output signal of the latching circuit 115 and the second comparator 120 and inverts and conditions the output signal $D_{OUT}$ for transfer to external circuits.

When the output of the inverter 125 is at is set to a logical 0 or a low output state, the first comparator 110 is inactive with the connection Q between the first comparator 110 and the latching circuit 115 set to the low output state. The second comparator 155 is active with the connection QZ between the second comparator 155 and the latching circuit 115 being set to a logical 1 or a high output state. The second comparator 155 compares input voltage signal $V_{IN}$ with the second reference voltage $V_{REF2}$. The tail current source $M_{N7}$ does not generate any static current as long as the input voltage signal $V_{IN}$ is less than the threshold voltage of the NMOS transistor $M_{N7}$. When the input voltage signal $V_{IN}$ reaches a voltage level greater than the second reference voltage $V_{REF2}$, the NMOS transistor $M_{N6}$ is deactivated and the NMOS transistor $M_{N5}$ is activated and the output of the latching circuit 115 and the second comparator 155 is set to low output state. The output of the inverter circuit 125 is set to the high state.

When the output of the inverter 125 is at is set to the logical 1 or the high output state, the first comparator 110 is active with the connection Q between the first comparator 110 and the latching circuit 115 set to the high output state. The second comparator 155 is inactive with the connection QZ between the second comparator 155 and the latching circuit 115 being set to a logical 0 or a low output state. The first comparator 110 compares input voltage signal $V_{IN}$ with the first reference voltage $V_{REF1}$ less a threshold voltage of the transistor $M_{N4}$ of the first comparator 110. The no static current generated as long as the input voltage signal $V_{IN}$ is greater than the first reference voltage $V_{REF1}$ less a threshold voltage of the transistor $M_{N4}$. When the input signal $V_{IN}$ becomes less than the first reference voltage $V_{REF1}$ less a threshold voltage of the transistor $M_{N4}$, the first comparator 110 is deactivated and the transistor $M_{N4}$ is turned on and the connection Q between the first comparator 110 and the latching circuit 115 is set to the low output state and the output QZ of the latching circuit 115 and second comparator 120 are set to the high output state. The output of the inverter 125 then becomes set to the low output state.

The input high voltage threshold $(V_{IH})$ is determined as the threshold voltage of the flipped gate anti-doped transistor $M_{FG1}$ less the threshold of the normal NMOS transistor $M_{N9}$ of the reference voltage generator. This value is equal to the bandgap voltage of silicon or another semiconductor material. The input low voltage level $(V_{IL})$ is determined as a threshold voltage of the flipped gate anti-doped transistor $M_{FG1}$ less the threshold voltage of the transistor $M_{N4}$ of the first comparator 110. This value is equal to the bandgap voltage of silicon less a hysteresis voltage.

The threshold of the input buffer is no longer simple equation, but high level input voltage level $(V_{IH})$ is lowered by the systematic offset of the comparator 155, while the low level input voltage $(V_{IL})$ is unchanged.

Figure 12:
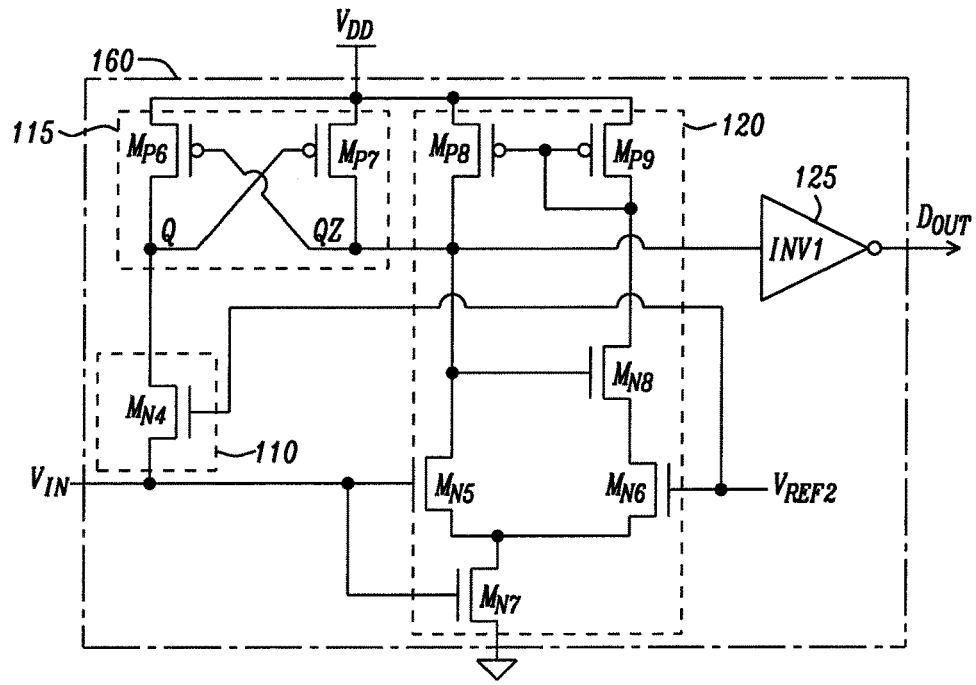
FIG. 12 is a schematic illustrating a third implementation of a receiver of an input buffer embodying the principals of the present disclosure.

FIG. 12 is a schematic illustrating a third implementation of a receiver 160 of an input buffer embodying the principals of the present disclosure. The receiver 160 is structured identically to the receiver 100 of FIG. 7 with the exception that the first reference voltage $V_{REF1}$ at the gate of the NMOS transistor $M_{N4}$ is replaced with the second reference voltage $V_{REF2}$.

The input high voltage threshold $(V_{IH})$ is determined as the threshold voltage of the flipped gate anti-doped transistor $M_{FG1}$ less the threshold of the normal NMOS transistor $M_{N9}$ of the reference voltage generator. This value is equal to the bandgap voltage of silicon or another semiconductor material. The input low voltage level $(V_{IL})$ is determined as a threshold voltage of the flipped gate anti-doped transistor $M_{FG1}$ less the threshold of the normal NMOS transistor $M_{N9}$ of the reference voltage generator and less the threshold voltage of the transistor $M_{N4}$ of the first comparator 110. This value is equal to the bandgap voltage of silicon less a hysteresis voltage.

Figure 13:
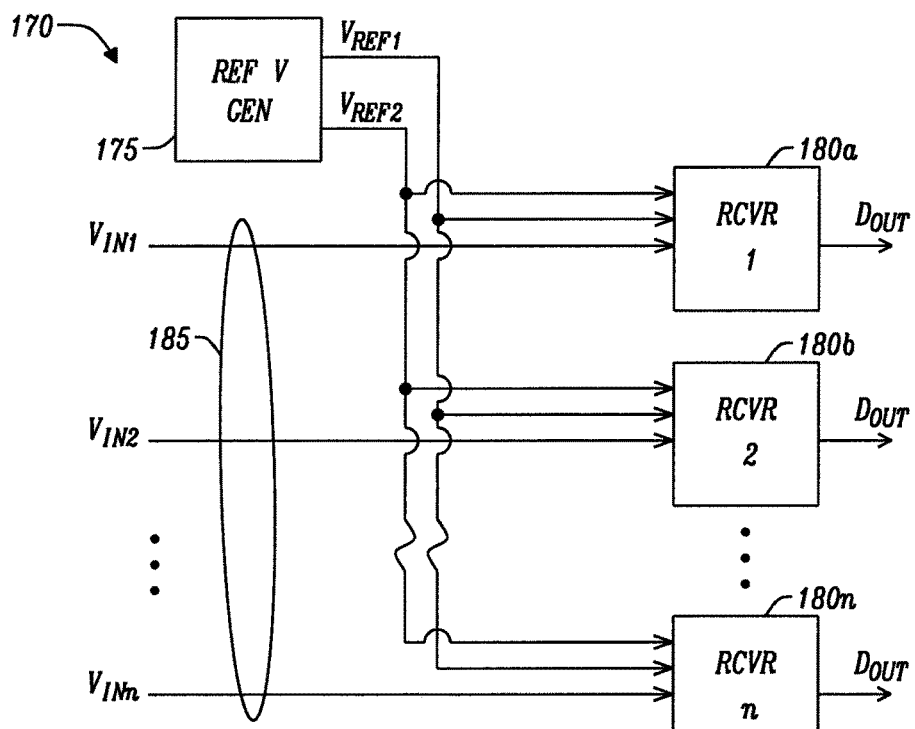
FIG. 13 is block diagram of an input bus receiver embodying the principles of this disclosure.

FIG. 13 is block diagram of an input bus receiver 170 embodying the principles of this disclosure. The input bus receiver 170 has a single dual voltage reference generator 175 that is structured and functions as the dual reference voltage generator circuit 105a of FIG. 7, 105b of FIG. 8A, 105c of FIG. 8B, 130 of FIG. 9, or 135 of FIG. 10. The input bus receiver 170 has multiple parallel receiver circuits 180a, 180b, . . . 180n. The multiple parallel receiver circuits 180a, 180b, . . . 180n are each structured and function as the receiver circuit 100 of FIG. 7. The bus input voltage signals 185 provides multiple input voltage signals $V_{IN1}$, $V_{IN2}$, . . . , $V_{INn}$. The multiple input voltage signals $V_{IN1}$, $V_{IN2}$, . . . , $V_{INn}$ are transmitted from an integrated circuit that has lower power supply voltage level and therefore has the first voltage range that is lower than that of the multiple parallel receiver circuits 180a, 180b, . . . 180n. The multiple parallel receiver circuits 180a, 180b, . . . 180n receive the multiple input voltage signals $V_{IN1}$, $V_{IN2}$, . . . , $V_{INn}$ and translate the first voltage range to that of a second voltage range of the output data $D_{OUT1}$, $D_{OUT2}$, . . . , $D_{OUTn}$ for transfer to the receiving integrated circuit operating at the higher power supply voltage source $V_{DD}$.

Figure 14A:
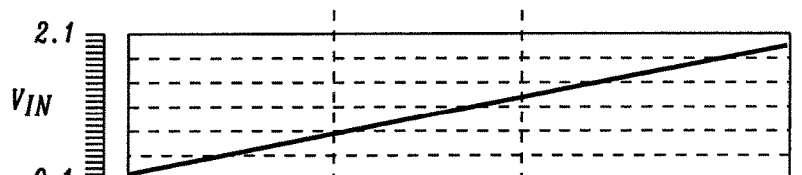
FIGS. 14A-14F are plots of a simulation of the receiver of FIG. 7 embodying the principals of this disclosure.
Figure 14B:
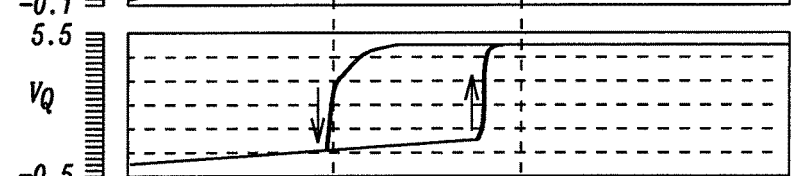
Figure 14C:
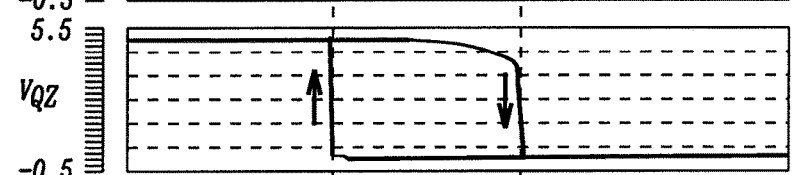
Figure 14D:
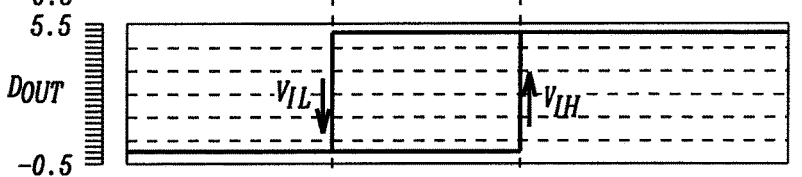
Figure 14E:
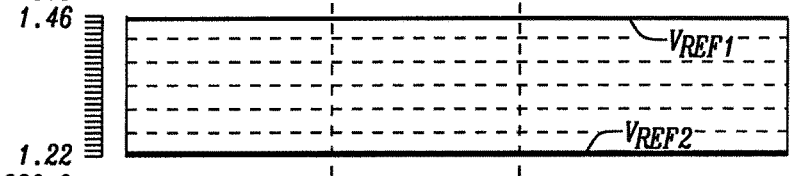
Figure 14F:
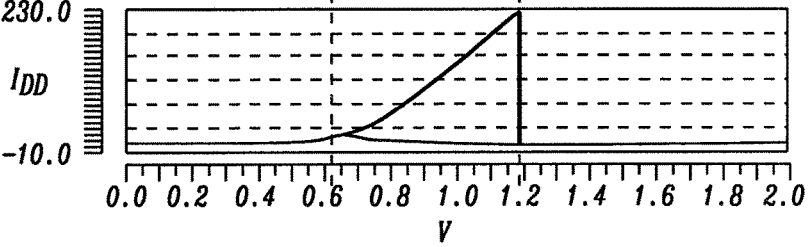

FIGS. 14A-14F are plots of a simulation of the receiver of FIG. 7 embodying the principals of this disclosure. FIG. 14A is a plot of the amplitude of the input voltage signal $V_{IN}$. FIGS. 14B and 14C are plots of the voltages $v_Q$ and $v_{QZ}$ at the connection Q between the first comparator 110 and the latching circuit 115 and connection QZ between the second comparator 120 and the latching circuit 115 versus the amplitude of the input voltage signal $V_{IN}$. FIG. 14D is a plot of the voltage at the output terminal $D_{OUT}$ of the inverter 125 versus the amplitude of the input voltage signal $V_{IN}$. FIG. 14E is a plot of the voltages of the first reference voltage $V_{REF1}$ and the second reference voltage $V_{REF2}$ from the dual reference voltage generator circuit 105a versus the amplitude of the input voltage signal $V_{IN}$. FIG. 14F is a plot of the current flowing from the power supply voltage source through the receiver circuit 100 versus the amplitude of the input voltage signal $V_{IN}$.

As shown in FIG. 14E, the first reference voltage $V_{REF1}$ is set at approximately 1.46V or the threshold voltage of the flipped-gate anti-doped NMOS transistor $M_{FG1}$. The first reference voltage $V_{REF1}$ is set at approximately 1.22V or the threshold voltage of the flipped-gate anti-doped NMOS transistor $M_{FG1}$ less the threshold voltage of the normal NMOS transistor $M_{N6}$. When the output $D_{OUT}$ of the inverter 125 is at is set to the voltage level of the logical 0 or approximately 0.0V and the input voltage signal $V_{IN}$ set less than the input high voltage level $V_{IH}$, the voltage level of the connection Q between the first comparator 110 and the latching circuit 115 set to the low output state or approximately 0.0V. The voltage level at the connection QZ between the second comparator 120 and the latching circuit 115 is set to high output state or approximately 5.0V. When the input voltage signal $V_{IN}$ reaches the voltage level of the input high voltage threshold ($V_{IH}$) or approximately 1.2V, the second comparator 120 compares input voltage signal $V_{IN}$ with the second reference voltage $V_{REF2}$. The tail current source $M_{N7}$ does not generate any static current $I_{DD}$ as long as the input voltage signal $V_{IN}$ is less than the threshold voltage of the NMOS transistor $M_{N7}$. The tail current source $M_{N7}$ begins to generate the static current $I_{DD}$ as shown in FIG. 14 F, when the input voltage signal $V_{IN}$ is greater than the threshold voltage of the NMOS transistor $M_{N7}$. When the input voltage signal $V_{IN}$ reaches a voltage level greater than the second reference voltage $V_{REF2}$, the NMOS transistor $M_{N6}$ is deactivated and the NMOS transistor $M_{N6}$ is activated and the output of the latching circuit 115 and the second comparator 120 is set to low output state. The output $D_{OUT}$ of the inverter circuit 125 is set to the high state.

When the output $D_{OUT}$ of the inverter 125 is at is set to the voltage level of the logical 1 or approximately 5.0V and the input voltage signal $V_{IN}$ set greater than the input low voltage level $V_{IL}$, the voltage level of the connection Q between the first comparator 110 and the latching circuit 115 set to the high output state or approximately 5.0V. The voltage level at the connection QZ between the second comparator 120 and the latching circuit 115 is set to low output state or approximately 0.0V. When the input voltage signal $V_{IN}$ reaches the voltage level of the input low voltage threshold ($V_{IL}$) or approximately 0.6V, the first comparator 110 compares input voltage signal $V_{IN}$ with the first reference voltage $V_{REF1}$. There is no static current $I_{DD}$ of FIG. 14F generated as long as the input voltage signal $V_{IN}$ is greater than the first reference voltage $V_{REF1}$ less a threshold voltage of the transistor $M_{N4}$. When the input signal $V_{IN}$ becomes less than the first reference voltage $V_{REF1}$ less a threshold voltage of the transistor $M_{N4}$, the first comparator 110 is deactivated and the transistor $M_{N4}$ is turned on and the connection Q between the first comparator 110 and the latching circuit 115 is set to the low output state causing a small static current $I_{DD}$ to be generated. The connection QZ between the second comparator 120 and the latching circuit 115 is set to the high output state. The output $D_{OUT}$ of the inverter 125 then becomes set to the low output state.

Figure 15A:
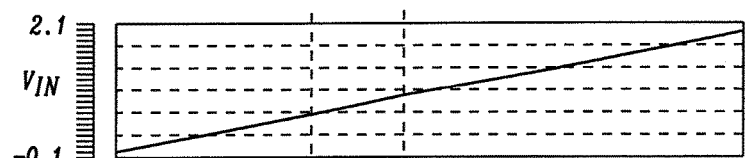
FIGS. 15A-F are plots of a simulation of the receiver of FIG. 11 embodying the principals of this disclosure.
Figure 15B:
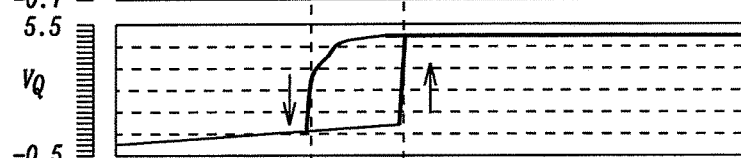
Figure 15C:
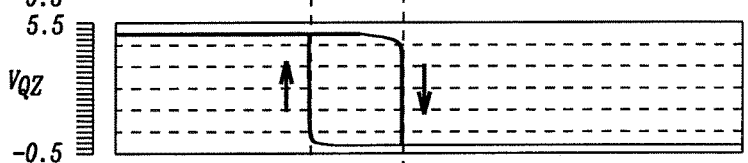
Figure 15D:
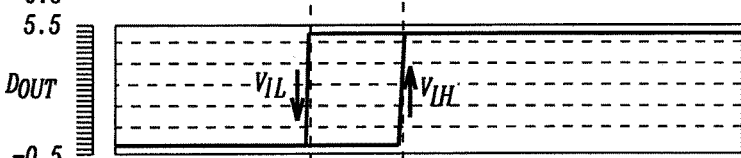
Figure 15E:
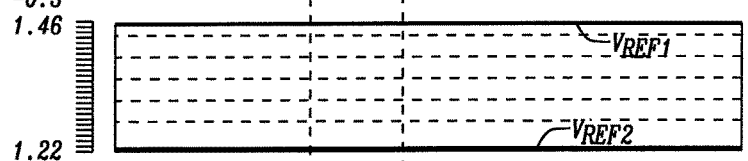
Figure 15F:
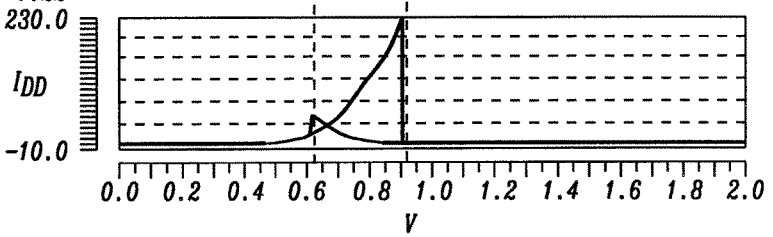

FIGS. 15A-15F are plots of a simulation of the receiver of FIG. 12 embodying the principals of this disclosure. FIG. 15A is a plot of the amplitude of the input voltage signal $V_{IN}$. FIGS. 15B and 15C are plots of the voltages $v_Q$ and $v_{QZ}$ at the connection Q between the first comparator 110 and the latching circuit 115 and connection QZ between the second comparator 120 and the latching circuit 115 versus the amplitude of the input voltage signal $V_{IN}$. FIG. 15D is a plot of the voltage at the output terminal $D_{OUT}$ of the inverter 125 versus the amplitude of the input voltage signal $V_{IN}$. FIG. 16E is a plot of the voltages of the first reference voltage $V_{REF1}$ and the second reference voltage $V_{REF2}$ from the dual reference voltage generator circuit 105a versus the amplitude of the input voltage signal $V_{IN}$. FIG. 15F is a plot of the current flowing from the power supply voltage source through the receiver circuit 100 versus the amplitude of the input voltage signal $V_{IN}$.

Figure 16:
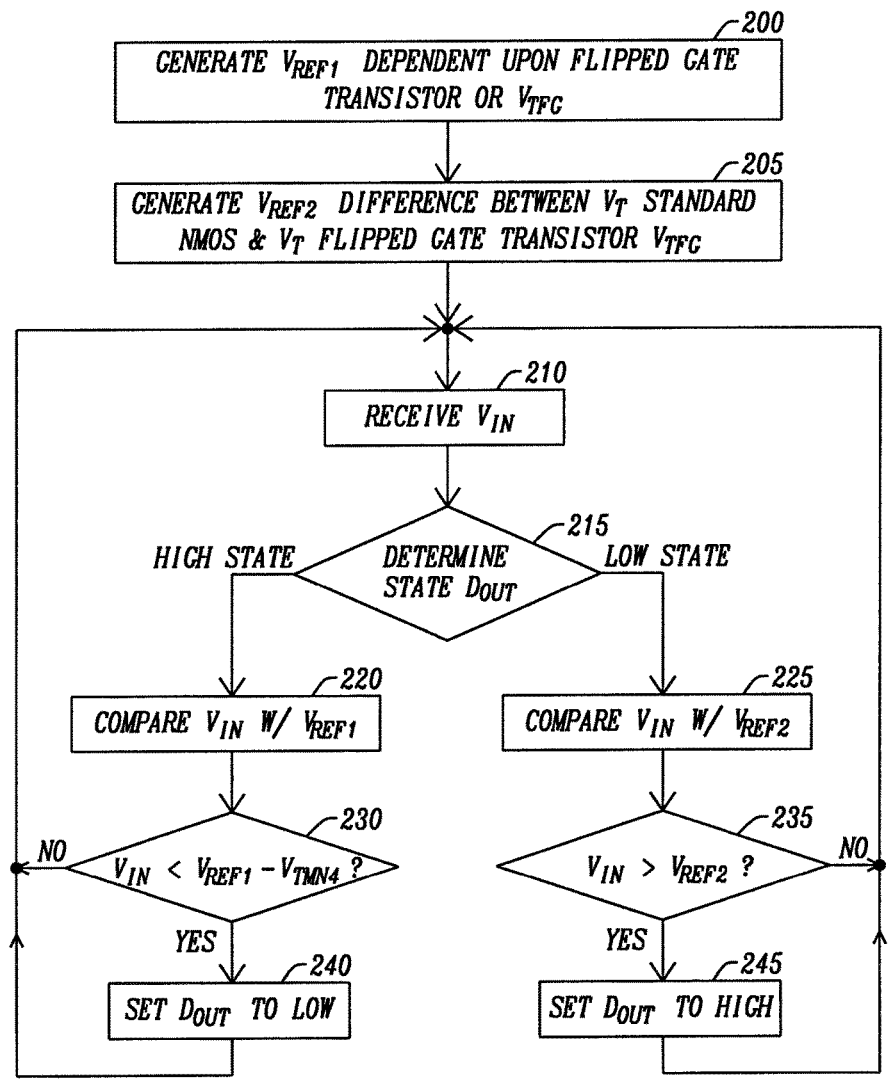
FIG. 16 is a flow chart detailing the method of operation of an input buffer embodying the principles of this disclosure.

As shown in FIG. 15E, the first reference voltage $V_{REF1}$ is set at approximately 1.46V or the threshold voltage of the flipped-gate anti-doped NMOS transistor $M_{FG1}$. The second reference voltage $V_{REF2}$ is set at approximately 1.22V or the threshold voltage of the flipped-gate anti-doped NMOS transistor $M_{FG1}$ less the threshold voltage of the normal NMOS transistor $M_{N9}$. However, as shown in FIG. 12 only the second reference voltage $V_{REF2}$ is used for the receiver. The reference block design and the complexity of reference voltage wiring routings in the chip design may be simplified. The drawback is the flexibility of hysteresis. The input high voltage threshold ($V_{IH}$) is equal to approximately second reference voltage $V_{REF2}$ or approximately 1.2V. The input low voltage threshold ($V_{IL}$) set to the second reference voltage $V_{REF2}$ less the threshold voltage of the transistor $M_{N4}$ or approximately 0.6V FIG. 16 is a flow chart detailing the method of operation of an input buffer embodying the principles of this disclosure. Referring FIGS. 7 and 16, a first reference voltage $V_{REF1}$ is generated (Box 200) such that the first reference voltage $V_{REF1}$ is dependent upon the threshold voltage of the flipped-gate anti-doped NMOS transistor $M_{FG1}$ of FIG. 7. A second reference voltage $V_{REF2}$ is generated (Box 205) such that the second reference voltage $V_{REF2}$ is dependent upon the threshold voltage of the flipped-gate anti-doped NMOS transistor $M_{FG1}$ less the threshold voltage of the normal NMOS transistor $M_{N9}$ of FIG. 7 or the bandgap voltage of silicon or another semiconductor material. An input signal is received (Box 210). The output state of the receiver is determined (Box 215).

If the output of the inverter 125 is at is at a low output state, the second comparator 120 compares (Box 225) input voltage signal $V_{IN}$ with the second reference voltage $V_{REF2}$. If the input voltage signal $V_{IN}$ is determined (Box 235) to be less than the second reference voltage $V_{REF2}$, the next sampling of the input voltage is received (Box 210) and the output state of the receiver is determined (Box 215). If the output of the inverter 125 is at is still at the low output state, the second comparator 120 compares (Box 225) input voltage signal $V_{IN}$ with the second reference voltage $V_{REF2}$. When the input voltage signal $V_{IN}$ is determined (Box 235) to be greater than the second reference voltage $V_{REF2}$, the output of the inverter circuit 125 is set (Box 245) to the high state.

The next sampling of the input voltage is received (Box 210) and the output state of the receiver is determined (Box 215). If the output of the inverter 125 is now set at the high output state, the first comparator 110 compares (Box 220) input voltage signal $V_{IN}$ with the first reference voltage $V_{REF1}$. When the input voltage signal $V_{IN}$ is determined (Box 230) to be greater than the first reference voltage $V_{REF1}$ less a threshold voltage of the transistor $M_{N4}$, the next sampling of the input voltage is received (Box 210) and the output state of the receiver is determined (Box 215). If the output of the inverter 125 is at is still at the high output state, the first comparator 110 compares (Box 220) input voltage signal $V_{IN}$ with the first reference voltage $V_{REF1}$. When the input voltage signal $V_{IN}$ is determined (Box 230) to be less than the first reference voltage $V_{REF1}$ less a threshold voltage of the transistor $M_{N4}$, the output of the inverter circuit 125 is set (Box 240) to the low state. The next sampling of the input voltage is received (Box 210) and the output state of the receiver is determined (Box 215). The process is repeated until a message is complete or receiver is disabled.

While this disclosure has been particularly shown and described with reference to the preferred embodiments thereof, it will be understood by those skilled in the art that various changes in form and details may be made without departing from the spirit and scope of the disclosure.

What is claimed is:

1. An input buffer circuit configured to operate with a high voltage supply and to receive an input signal at a first voltage range from a signal source operating at a low voltage supply, wherein the input buffer comprises:

a dual reference voltage generator circuit comprising a current source, a normal transistor of the first conductivity type, and a flipped-gate anti-doped transistor of the first conductivity type connected between a power supply voltage source and a ground reference source and configured such that a first reference voltage is the threshold voltage of the flipped-gate anti-doped transistor of the first conductivity type and a second reference voltage is the threshold voltage of the flipped-gate anti-doped transistor of the first conductivity type less the threshold voltage of the normal transistor of the first conductivity type; and a receiver connected to the dual reference voltage generator circuit to receive the first reference voltage and the second reference voltage, and connected to the signal source to receive the input signal, and configured to compare the input signal with the second reference voltage signal, when the output of the receiver is in the low output state, and when the input signal and compare the input signal with the first reference voltage signal, when the output of the receiver is in the high output state, when the input signal is less than the first reference voltage, the output of the receiver is set to the low output state.

2. The input buffer circuit of claim 1 wherein a first terminal of the current source is connected to a power supply, the second terminal of the current source is connected to a gate and drain of the normal transistor of the first conductivity type and to a first output terminal of the dual reference voltage generator circuit that provides the first reference voltage, a source of the normal transistor of the first conductivity type is connected to a drain of the flipped-gate anti-doped transistor of the first conductivity type and to a second output terminal of the dual reference voltage generator circuit that provides the second reference voltage, the flipped-gate anti-doped transistor of the first conductivity type comprises a source connected to a ground reference source, and the gate of the flipped-gate anti-doped transistor of the first conductivity type is connected to the gates of the normal transistor and the second terminal of the current source.

3. The input buffer circuit of claim 1 wherein the receiver comprises a first comparator, a second comparator, and a latching circuit configured such that the first comparator is connected to receive the input voltage and the first reference voltage, the second comparator is connected to receive the input voltage and the second reference voltage, the latching circuit is connected to an output of the first comparator and to an output of the second comparator and to an input of an inverter circuit, and the output of the inverter circuit is connected to provide the data output signal from the input buffer.

4. The input buffer circuit of claim 3 wherein the first comparator comprises a first MOS transistor with a source connected to receive the input signal, a gate of the first transistor of the first conductivity type is connected to receive the first reference voltage, and a drain of the first transistor of the first conductivity type connected to the latching circuit.

5. The input buffer circuit of claim 3 wherein the second comparator comprises a differential pair of transistors wherein the input signal is connected to a gate of a first transistor of the first conductivity type of the differential pair of transistors and the second reference voltage is connected to a gate of a second transistor of the first conductivity type of the differential pair of transistors, sources of the first and second transistors of the first conductivity type are connected together and to a first terminal of a tail current source and a second terminal of the tail current source is connected to the ground reference source.

6. The input buffer circuit of claim 5 wherein the tail current source is formed of a third transistor of the first conductivity type with the gate connected to receive the input signal, the source connected to the ground reference source, and the drain of the third transistor of the first conductivity type is connected to the coupled sources of the first and second transistors of a first conductivity type.

7. The input buffer circuit of claim 3 wherein a drain of the first transistor of the first conductivity type of the differential pair of transistors is connected to a mirror leg of a current mirror and to the latching circuit.

8. The input buffer circuit of claim 7 wherein a drain of the second transistor of the first conductivity type of the differential pair of transistors is connected to a source of a gating transistor of the first conductivity type, a gate of the gating transistor of the first conductivity type is connected to drain of the first transistor of the first conductivity type of the differential pair of transistors, and a drain of the gating transistor of the first conductivity type is connected to a reference leg of the current mirror.

9. The input buffer circuit of claim 8 wherein the current mirror comprises a first transistor of the second conductivity type and a second transistor of the second conductivity type connected such that sources of the first transistor of the second conductivity type and the second transistor of the second conductivity type are connected together to the power supply voltage source, gates of the first transistor of the second conductivity type and the second transistor of the second conductivity type are connected together and connected to the drain of the second transistor of the second conductivity type and thus to the drain of the gating transistor to form the reference leg of the current mirror, and a drain of the first transistor of the second conductivity type is connected to form the output of the second comparator.

10. The input buffer circuit of claim 8 wherein the latching circuit comprises of a third transistor of the second conductivity type and a fourth transistor of the second conductivity type connected such that sources of the third transistor of the second conductivity type and the fourth transistor of the second conductivity type are connected together to the power supply voltage source, a gate of the third transistor of the second conductivity type is connected to a drain of the fourth transistor of the second conductivity type and to the output of the second comparator and the input of the inverter, and a gate of the fourth transistor of the second conductivity type is connected to a drain of the third transistor of the second conductivity type and to the output of the first comparator.

11. The input buffer circuit of claim 3 wherein the inverter circuit receives the output signal of the latching circuit and the second comparator and inverts and conditions the signal for transfer to external circuits.

12. The input buffer circuit of claim 11 wherein when the output of the inverter is at the low output state, the first comparator is inactive with the connection between the first comparator and the latching circuit is set to the low output state, the second comparator is active with the connection between the second comparator and the latching circuit being the high output state; the second comparator compares input signal with the second reference voltage such that when the input signal reaches a voltage level greater than the second reference voltage, the second transistor of the first conductivity type of the differential pair of transistors is deactivated and the first transistor of the first conductivity type of the differential pair of transistors is activated and the output of the latching circuit and the second comparator is set to low output state and thus the output of the inverter circuit is set to the high state.

13. The input buffer circuit of claim 11 wherein when the output of the inverter is at the high output state, the first comparator is active with the connection between the first comparator and the latching circuit is set to the high output state, and the second comparator is inactive with the connection between the second comparator and the latching circuit being at a low output state, wherein when the first comparator compares the input signal with the first reference voltage is less a threshold voltage of the first transistor of the first comparator, the first comparator is deactivated and the first transistor of the first comparator is turned on and the connection between the first comparator and the latching circuit is set to the low output state and the output of the latching circuit and second comparator are set to the high output state and thus the output of the inverter then becomes set to the low output state.

14. An input bus receiver configured for configured to operate with a high voltage supply and to receive a plurality input signal at a first voltage range from a signal source operating at a low voltage supply, wherein the input bus receiver comprises:
a dual reference voltage generator circuit comprising a current source, a normal transistor of the first conductivity type, and a flipped-gate anti-doped transistor of the first conductivity type connected between a power supply voltage source and a ground reference source and configured such that a first reference voltage is the threshold voltage of the flipped-gate anti-doped transistor of the first conductivity type and a second reference voltage is the threshold voltage of the flipped-gate anti-doped transistor of the first conductivity type less the threshold voltage of the normal transistor of the first conductivity type; and
a plurality of receivers connected to the signal source such that each receiver of the plurality of receiver receives one of the plurality of input signals and each of the receiver is connected to the dual reference voltage generator circuit to receive the first reference voltage and the second reference voltage, and configured to compare the input signal with the second reference voltage signal, when the output of the receiver is in the low output state, and when the input signal and compare the input signal with the first reference voltage signal, when the output of the receiver is in the high output state, when the input signal is less than the first reference voltage, the output of the receiver is set to the low output state.

15. The input bus receiver of claim 14 wherein within the dual reference voltage generator circuit a first terminal of the current source is connected to a power supply, the second terminal of the current source is connected to a gate and drain of the normal transistor of the first conductivity type and to a first output terminal of the dual reference voltage generator circuit that provides the first reference voltage, a source of the normal transistor of the first conductivity type is connected to a drain of the flipped-gate anti-doped transistor of the first conductivity type and to a second output terminal of the dual reference voltage generator circuit that provides the second reference voltage, the flipped-gate anti-doped transistor of the first conductivity type comprises a source connected to a ground reference source, and the gate of the flipped-gate anti-doped transistor of the first conductivity type is connected to the gates of the normal transistor and the second terminal of the current source.

16. The input bus receiver of claim 14 wherein each receiver of the plurality of receivers comprises a first comparator, a second comparator, and a latching circuit configured such that the first comparator is connected to receive the input voltage and the first reference voltage, the second comparator is connected to receive the input voltage and the second reference voltage, the latching circuit is connected to an output of the first comparator and to an output of the second comparator and to an input of an inverter circuit, and the output of the inverter circuit is connected to provide the data output signal from the input buffer.

17. The input bus receiver of claim 16 wherein the first comparator comprises a first MOS transistor with a source connected to receive the input signal, a gate of the first transistor of the first conductivity type is connected to receive the first reference voltage, and a drain of the first transistor of the first conductivity type connected to the latching circuit.

18. The input bus receiver of claim 16 wherein the second comparator comprises a differential pair of transistors wherein the input signal is connected to a gate of a first transistor of the first conductivity type of the differential pair of transistors and the second reference voltage is connected to a gate of a second transistor of the first conductivity type of the differential pair of transistors, sources of the first and second transistors of the first conductivity type are connected together and to a first terminal of a tail current source and a second terminal of the tail current source is connected to the ground reference source.

19. The input bus receiver of claim 18 wherein the tail current source is formed of a third transistor of the first conductivity type with the gate connected to receive the input signal, the source connected to the ground reference source, and the drain of the third transistor of the first conductivity type is connected to the coupled sources of the first and second transistors of a first conductivity type.

20. The input bus receiver of claim 16 wherein a drain of the first transistor of the first conductivity type of the differential pair of transistors is connected to a mirror leg of a current mirror and to the latching circuit.

21. The input bus receiver of claim 20 wherein a drain of the second transistor of the first conductivity type of the differential pair of transistors is connected to a source of a gating transistor of the first conductivity type, a gate of the gating transistor of the first conductivity type is connected to drain of the first transistor of the first conductivity type of the differential pair of transistors, and a drain of the gating transistor of the first conductivity type is connected to a reference leg of the current mirror.

22. The input bus receiver of claim 21 wherein the current mirror comprises a first transistor of the second conductivity type and a second transistor of the second conductivity type connected such that sources of the first transistor of the second conductivity type and the second transistor of the second conductivity type are connected together to the power supply voltage source, gates of the first transistor of the second conductivity type and the second transistor of the second conductivity type are connected together and connected to the drain of the second transistor of the second conductivity type and thus to the drain of the gating transistor to form the reference leg of the current mirror, and a drain of the first transistor of the second conductivity type is connected to form the output of the second comparator.

23. The input bus receiver of claim 21 wherein the latching circuit comprises of a third transistor of the second conductivity type and a fourth transistor of the second conductivity type connected such that sources of the third transistor of the second conductivity type and the fourth transistor of the second conductivity type are connected together to the power supply voltage source, a gate of the third transistor of the second conductivity type is connected to a drain of the fourth transistor of the second conductivity type and to the output of the second comparator and the input of the inverter, and a gate of the fourth transistor of the second conductivity type is connected to a drain of the third transistor of the second conductivity type and to the output of the first comparator.

24. The input bus receiver of claim 23 wherein when the output of the inverter is at the low output state, the first comparator is inactive with the connection between the first comparator and the latching circuit is set to the low output state, the second comparator is active with the connection between the second comparator and the latching circuit being the high output state; the second comparator compares input signal with the second reference voltage such that when the input signal reaches a voltage level greater than the second reference voltage, the second transistor of the first conductivity type of the differential pair of transistors is deactivated and the first transistor of the first conductivity type of the differential pair of transistors is activated and the output of the latching circuit and the second comparator is set to low output state and thus the output of the inverter circuit is set to the high state.

25. The input bus receiver of claim 23 wherein when the output of the inverter is at the high output state, the first comparator is active with the connection between the first comparator and the latching circuit is set to the high output state, and the second comparator is inactive with the connection between the second comparator and the latching circuit being at a low output state, wherein when the first comparator compares the input signal with the first reference voltage is less a threshold voltage of the first transistor of the first comparator, the first comparator is deactivated and the first transistor of the first comparator is turned on and the connection between the first comparator and the latching circuit is set to the low output state and the output of the latching circuit and second comparator are set to the high output state and thus the output of the inverter then becomes set to the low output state.

26. The input bus receiver of claim 14 wherein the inverter circuit receives the output signal of the latching circuit and the second comparator and inverts and conditions the signal for transfer to external circuits.

27. A method for operation of a receiver comprises the steps of:
generating a first reference voltage dependent upon a threshold voltage of the flipped gate anti-doped transistor;
generating a second reference voltage dependent upon a difference between a standard or normal transistor of the first conductivity type and a threshold voltage of the flipped gate anti-doped transistor;
receiving an input signal;
comparing the input signal with the first reference voltage and the second reference voltage;
when the input voltage state is less than the first reference voltage less a threshold voltage of threshold voltage of a comparison device, setting the output of the receiver to the low output state; and
when the input voltage state is greater than the second reference voltage signal, setting the output of the receiver to the high output state.

28. The method for operation of a receiver of claim 27 further comprising the steps of:
determining if an output of the receiver is set to either a high output state or a low output state.

29. The method for operation of a receiver of claim 28 wherein the step of comparing the comparing the input signal with the first reference voltage and the second reference voltage comprises the step of:
when the output of the receiver is in the high output state, comparing the input signal with the first reference voltage signal.

30. The method for operation of a receiver of claim 29 wherein the step of comparing the comparing the input signal with the first reference voltage and the second reference voltage comprises the step of:

when the input signal voltage is not less than the first reference voltage less a threshold voltage of a comparison circuit, the output of the receiver is not changed;

capturing a next sampling of the input signal; and repeating the step of comparing the comparing the input signal with the first reference voltage and the second reference voltage.

31. The method for operation of a receiver of claim 28 wherein the step of comparing the comparing the input signal with the first reference voltage and the second reference voltage comprises the step of:

when the output of the receiver is in the low output state, comparing the input signal with the second reference voltage signal.

32. The method for operation of a receiver of claim 31 wherein the step of comparing the comparing the input signal with the first reference voltage and the second reference voltage comprises the step of:

when the input signal voltage is not greater than the second reference voltage, the output of the receiver is not changed;

capturing a next sampling of the input signal; and repeating the step of comparing the comparing the input signal with the first reference voltage and the second reference voltage.

\* \* \* \* \*